(12) United States Patent
Pandey et al.

(10) Patent No.: US 12,733,452 B2
(45) Date of Patent: Sep. 8, 2026

(54) CASSETTE STRUCTURES AND RELATED METHODS FOR BATCH PROCESSING IN EPITAXIAL DEPOSITION OPERATIONS

(71) Applicant: Applied Materials, Inc., Santa Clara, CA (US)

(72) Inventors: Vishwas Kumar Pandey, Madhya Pradesh (IN); Kartik Bhupendra Shah, Saratoga, CA (US); Ala Moradian, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 735 days.

(21) Appl. No.: 17/959,189

(22) Filed: Oct. 3, 2022

(65) Prior Publication Data

US 2024/0112931 A1 Apr. 4, 2024

(51) Int. Cl.

| | |
|---|---|
| ***H10P 72/76*** | (2026.01) |
| ***C30B 25/14*** | (2006.01) |
| ***H10P 72/00*** | (2026.01) |

(52) U.S. Cl.

CPC .......... *H10P 72/7621* (2026.01); *C30B 25/14* (2013.01); *H10P 72/0436* (2026.01); (Continued)

(58) Field of Classification Search

CPC ........... H01L 21/0228; H01L 21/67115; H01L 21/67161; H01L 21/67248; (Continued)

(56) References Cited

U.S. PATENT DOCUMENTS

| | | | |
|---|---|---|---|
| 8,673,081 | B2 | 3/2014 | Sivaramakrishnan et al. |
| 9,620,395 | B2 | 4/2017 | Yang et al. |

(Continued)

FOREIGN PATENT DOCUMENTS

| | | | |
|---|---|---|---|
| CN | 109791904 A | 5/2019 | |
| CN | 112382596 A * | 2/2021 | .......... H01L 21/223 |

(Continued)

OTHER PUBLICATIONS

International Search Report and Written Opinion dated Aug. 14, 2023 for Application No. PCT/US2023/017561.

(Continued)

*Primary Examiner* — Gordon Baldwin
*Assistant Examiner* — Todd M Seoane
(74) *Attorney, Agent, or Firm* — Patterson + Sheridan, LLP

(57) ABSTRACT

The present disclosure relates to cassette structures and related methods for batch processing in epitaxial deposition operations. In one implementation, a cassette configured for disposition in a substrate processing chamber includes a first wall, a second wall spaced from the first wall, and one or more sidewalls extending between and coupled to the first wall and the second wall. The cassette includes one or more inlet openings formed in the one or more sidewalls, and one or more outlet openings formed in the one or more sidewalls opposite the one or more inlet openings. The cassette includes a plurality of levels that include a plurality of substrate supports mounted to the one or more sidewalls and spaced from each other along the one or more sidewalls.

20 Claims, 10 Drawing Sheets

(52) U.S. Cl.
CPC ...... *H10P 72/0452* (2026.01); *H10P 72/7616* (2026.01); *H10P 72/0604* (2026.01)

(58) Field of Classification Search
CPC ......... H01L 21/67253; H01L 21/67303; H01L 21/67306; H01L 21/6732; H01L 21/67323; H01L 21/67346; H01L 21/67757; H01L 21/68742; H01L 21/6875; H01L 21/68764; H01L 21/68771; H01L 21/68785; C30B 25/08; C30B 25/10; C30B 25/14; C30B 25/165; C23C 16/0218; C23C 16/4402; C23C 16/4408; C23C 16/4409; C23C 16/45504; C23C 16/45517; C23C 16/45521; C23C 16/45546; C23C 16/45548; C23C 16/45561–4558; C23C 16/45591; C23C 16/4581; C23C 16/4583; C23C 16/481; C23C 16/488; H01J 37/3244; H01J 37/32477; H10P 72/0452; H10P 72/6342; H10P 72/0604; H10P 72/0434; H10P 72/0436; H10P 72/7621; H10P 72/7616
See application file for complete search history.

(56) References Cited

U.S. PATENT DOCUMENTS

| | | | | |
|---|---|---|---|---|
| 9,640,416 | B2 | 5/2017 | Arai | |
| 9,871,350 | B2 | 1/2018 | McLaurin et al. | |
| 9,875,895 | B2 | 1/2018 | Yang et al. | |
| 10,161,036 | B2 | 12/2018 | Hyon et al. | |
| 10,392,702 | B2 | 8/2019 | Jung et al. | |
| 10,741,396 | B2 | 8/2020 | Jung et al. | |
| 10,903,625 | B2 | 1/2021 | McLaurin et al. | |
| 11,111,580 | B2 | 9/2021 | Kang et al. | |
| 2002/0036066 | A1 * | 3/2002 | Ogawa | H01J 37/3244 257/E21.252 |
| 2003/0049372 | A1 * | 3/2003 | Cook | C23C 16/345 118/724 |
| 2007/0084406 | A1 * | 4/2007 | Yudovsky | H01L 21/67109 156/345.31 |
| 2007/0215596 | A1 * | 9/2007 | Wintenberger | H01L 21/67115 219/406 |
| 2016/0348240 | A1 * | 12/2016 | Burrows | H01L 21/6719 |
| 2018/0033652 | A1 * | 2/2018 | Samir | H01L 21/67115 |
| 2018/0272390 | A1 * | 9/2018 | Ulloa | H01L 21/67303 |
| 2018/0315626 | A1 | 11/2018 | Franklin | |
| 2020/0032386 | A1 * | 1/2020 | Aderhold | H01L 21/6838 |
| 2021/0028075 | A1 | 1/2021 | Zhu et al. | |
| 2021/0324514 | A1 | 10/2021 | Ye et al. | |
| 2022/0121196 | A1 | 4/2022 | Omori | |
| 2022/0162751 | A1 | 5/2022 | Haanstra et al. | |
| 2022/0170156 | A1 | 6/2022 | Jdira et al. | |
| 2022/0181193 | A1 | 6/2022 | Gao et al. | |
| 2022/0189804 | A1 | 6/2022 | Luan et al. | |
| 2022/0199444 | A1 | 6/2022 | Oosterlaken et al. | |
| 2022/0254668 | A1 * | 8/2022 | Oosterlaken | H01L 21/67303 |
| 2022/0268520 | A1 | 8/2022 | Oosterlaken et al. | |
| 2022/0298643 | A1 | 9/2022 | Kajbafvala et al. | |
| 2022/0298672 | A1 | 9/2022 | M'Saad et al. | |
| 2022/0301829 | A1 | 9/2022 | Yoshikawa | |
| 2022/0301905 | A1 | 9/2022 | Ye et al. | |
| 2022/0301906 | A1 | 9/2022 | Naik et al. | |
| 2022/0352006 | A1 | 11/2022 | Huang et al. | |
| 2022/0359246 | A1 | 11/2022 | Umeoka | |

FOREIGN PATENT DOCUMENTS

| | | | | |
|---|---|---|---|---|
| CN | 113990780 | A | | 1/2022 |
| CN | 111893567 | B | | 2/2022 |
| CN | 114000192 | A | | 2/2022 |
| CN | 111254487 | B | | 3/2022 |
| CN | 114138030 | A | | 3/2022 |
| CN | 114158145 | A | | 3/2022 |
| CN | 114351249 | A | | 4/2022 |
| CN | 111235551 | B | | 5/2022 |
| CN | 114481311 | A | | 5/2022 |
| CN | 114540947 | A | | 5/2022 |
| CN | 114540948 | A | | 5/2022 |
| CN | 114551331 | A | | 5/2022 |
| CN | 114613703 | A | | 6/2022 |
| CN | 114743924 | A | | 7/2022 |
| CN | 114823428 | A | | 7/2022 |
| CN | 114855272 | A | | 8/2022 |
| CN | 114883221 | A | | 8/2022 |
| CN | 114914181 | A | | 8/2022 |
| CN | 114927450 | A | | 8/2022 |
| CN | 115020281 | A | | 9/2022 |
| CN | 115101432 | A | | 9/2022 |
| CN | 115101443 | A | | 9/2022 |
| CN | 115101470 | A | | 9/2022 |
| CN | 115233303 | A | | 10/2022 |
| CN | 115235257 | A | | 10/2022 |
| CN | 115274510 | A | | 11/2022 |
| CN | 115312432 | A | | 11/2022 |
| CN | 115404543 | A | | 11/2022 |
| JP | H05-41358 | A | | 2/1993 |
| JP | H09199437 | A | * | 7/1997 |
| JP | 2002222806 | A | * | 8/2002 |
| JP | 2005-209875 | A | | 8/2005 |
| JP | 2008172205 | A | * | 7/2008 |
| JP | 2009-81259 | A | | 4/2009 |
| JP | 2011-258890 | A | | 12/2011 |
| JP | 2013-187459 | A | | 9/2013 |
| WO | 2015175175 | A1 | | 11/2015 |
| WO | 2017040868 | A1 | | 3/2017 |
| WO | 2021/186677 | A1 | | 9/2021 |
| WO | 2022031422 | A1 | | 2/2022 |

OTHER PUBLICATIONS

Japanese Office Action for Application No. 2025-519125 dated Mar. 10, 2026.

Korean Office Action dated Nov. 28, 2025 for Application No. 10-2025-7014663.

* cited by examiner

100
CPU
1071
MEMORY
1072
SUPPORT
CIRCUITS
1073
1070
P1
P2
Z
X
Y 235
234
234
234b
234a
234c
1100
1101b
1101c
1102
1101a
1103

233
234
1001
1001
1001
1001
1000
1003
1002

233
234
901
901
901
901
900

CASSETTE STRUCTURES AND RELATED METHODS FOR BATCH PROCESSING IN EPITAXIAL DEPOSITION OPERATIONS

BACKGROUND

Field

The present disclosure relates to cassette structures and related methods for batch processing in epitaxial deposition operations.

Description of the Related Art

Semiconductor substrates are processed for a wide variety of applications, including the fabrication of integrated devices and microdevices. However, operations (such as epitaxial deposition operations) can be long, expensive, and inefficient, and can have limited capacity and throughput. Operations can also be limited with respect to film growth rates. Moreover, hardware can involve relatively large dimensions that occupy higher footprints in manufacturing facilities. Additionally, operations can involve hindrances with temperature control, gas control, and/or substrate center-to-edge control and adjustability. Such hindrances can be exacerbated in relatively complex processing operations, and/or in operations that call for one-sided deposition.

Therefore, a need exists for improved apparatuses and methods in semiconductor processing.

SUMMARY

The present disclosure relates to cassette structures and related methods for batch processing in epitaxial deposition operations.

In one implementation, a cassette configured for disposition in a substrate processing chamber includes a first wall, a second wall spaced from the first wall, and one or more sidewalls extending between and coupled to the first wall and the second wall. The cassette includes one or more inlet openings formed in the one or more sidewalls, and one or more outlet openings formed in the one or more sidewalls opposite the one or more inlet openings. The cassette includes a plurality of levels that include a plurality of substrate supports mounted to the one or more sidewalls and spaced from each other along the one or more sidewalls.

In one implementation, an apparatus for substrate processing includes a chamber body that includes a processing volume, a plurality of gas inject passages formed in the chamber body and positioned as a plurality of inject levels, and one or more gas exhaust passages formed in the chamber body opposite the plurality of gas inject passages. The apparatus includes one or more heat sources configured to generate heat, a pedestal assembly positioned in the processing volume, and a cassette positioned in the processing volume and at least partially supported by the pedestal assembly. The cassette includes a first wall, a second wall spaced from the first wall, and one or more sidewalls extending between the first wall and the second wall. The cassette includes a plurality of inlet openings formed in the one or more sidewalls and positioned as a plurality of flow levels, each flow level of the plurality of flow levels aligning with and in fluid communication with a respective inject level of the plurality of inject levels. The cassette includes one or more outlet openings formed in the one or more sidewalls opposite the plurality of inlet openings, and a plurality of substrate supports mounted to the one or more sidewalls.

In one implementation, a method of processing a plurality of substrates includes positioning a first substrate in a processing volume of a chamber and positioning a second substrate in the processing volume at a substrate spacing from the first substrate. The method includes positioning a third substrate on the second substrate such that an outer surface of the third substrate contacts an outer surface of the second substrate. The method includes flowing one or more process gases into the processing volume, and heating the first substrate, the second substrate, and the third substrate. The method includes simultaneously depositing one or more layers on each of the first substrate the second substrate, and the third substrate while the third substrate is contacting the second substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to cassette structures and related methods for batch processing in epitaxial deposition operations.

The disclosure contemplates that terms such as "couples," "coupling," "couple," and "coupled" may include but are not limited to welding, fusing, melting together, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling, such as indirect coupling through components such as links.

Figure 1A:
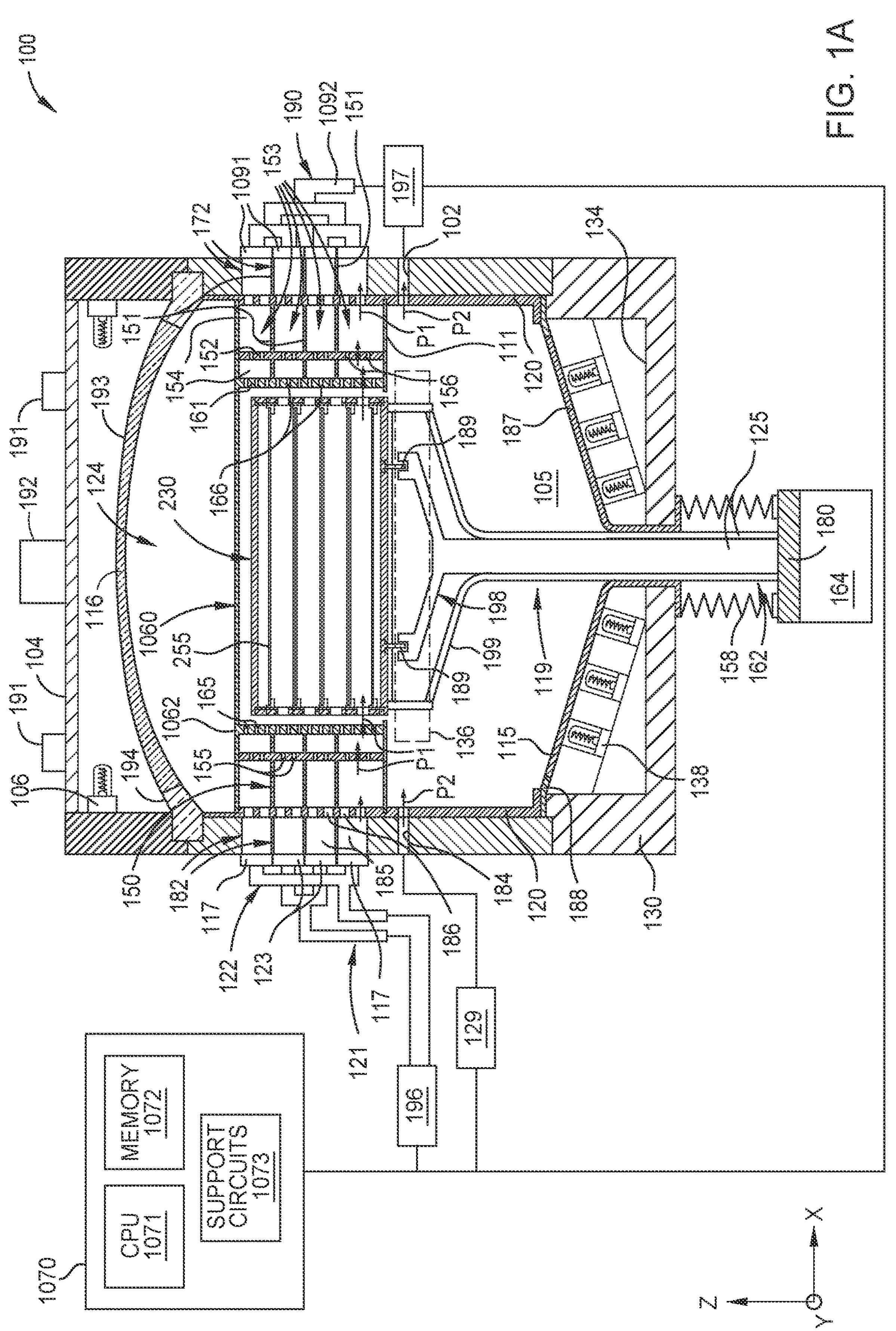
FIG. 1A is a schematic cross-sectional side view of a processing apparatus, according to one implementation.
Figure 1B:
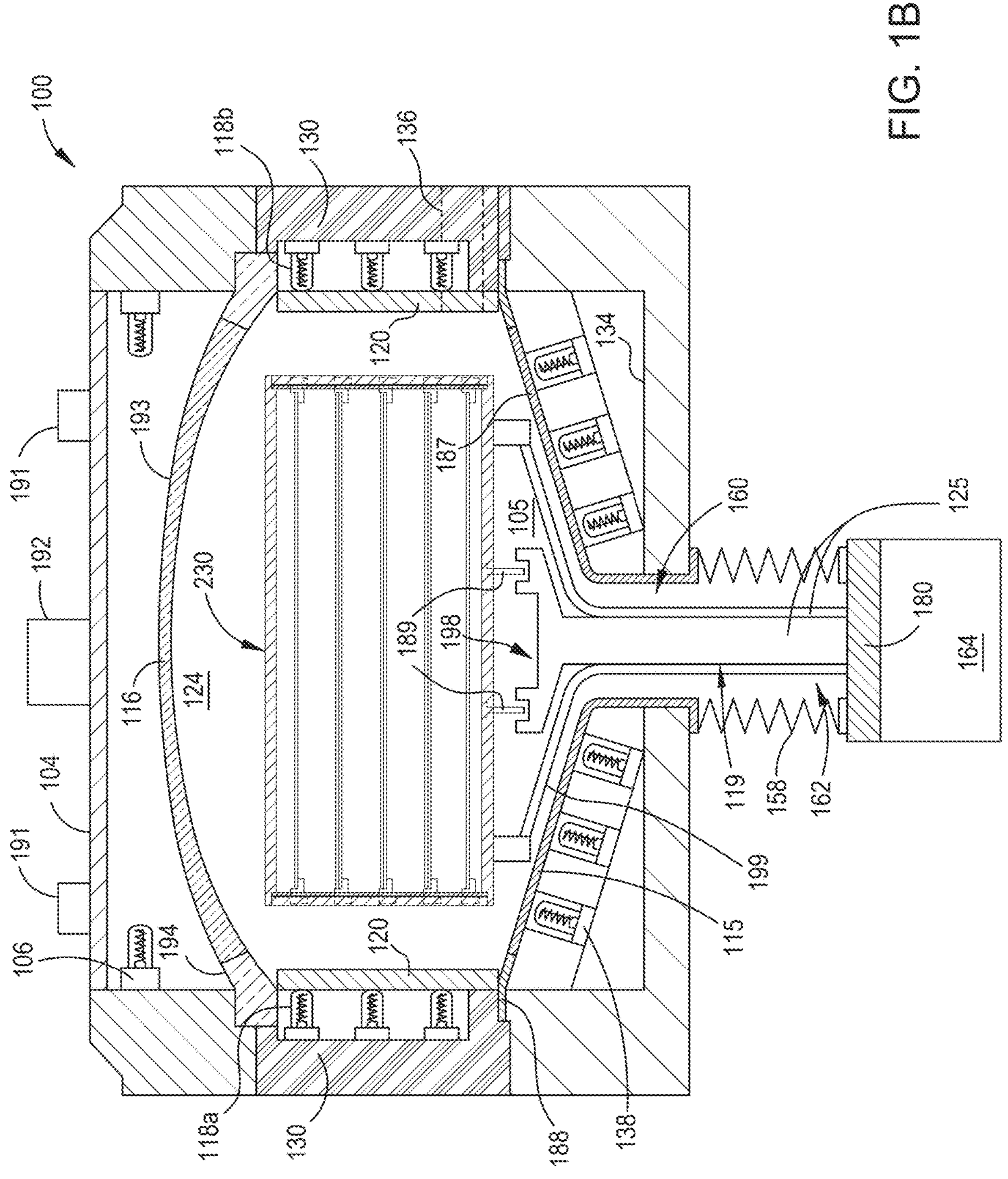
FIG. 1B is a schematic cross-sectional side view of the processing apparatus shown in FIG. 1A, according to one implementation.

FIG. 1A is a schematic cross-sectional side view of a processing apparatus 100, according to one implementation. The side heat sources 118*a*, 118*b* shown in FIG. 1B are not shown in FIG. 1A for visual clarity purposes. The processing apparatus 100 includes a processing chamber having a chamber body 130 that defines a processing volume 124.

A cassette 230 is positioned in the processing volume 124 and at least partially supported by the pedestal assembly 119. The cassette 230 supports a plurality of substrates 255 for simultaneous processing (e.g., epitaxial deposition). In the implementation shown in FIG. 1A, the cassette 230 supports eight substrates. The cassette 230 can support other numbers of substrates, including but not limited to two substrates 255, three substrates 255, six substrates 255, or twelve substrates 255.

The processing apparatus 100 includes an upper window 116, such as a dome, disposed between a lid 104 and the processing volume 124. The processing apparatus 100 includes a lower window 115 disposed below the processing volume 124. One or more upper heat sources 106 are positioned above the processing volume 124 and the upper window 116. The one or more upper heat sources 106 can be radiant heat sources such as lamps, for example halogen lamps. The one or more upper heat sources 106 are disposed between the upper window 116 and the lid 104. The upper heat sources 106 are positioned to provide uniform heating of the substrates 255. One or more lower heat sources 138 are positioned below the processing volume 124 and the lower window 115. The one or more lower radiant heat sources 138 can be radiant heat sources such as lamps, for example halogen lamps. The lower heat sources 138 are disposed between the lower window 115 and a chamber body bottom 134. The lower heat sources 138 are positioned to provide uniform heating of the substrates 255.

The present disclosure contemplates that other heat sources may be used (in addition to or in place of the lamps) for the various heat sources described herein. For example, resistive heaters, light emitting diodes (LEDs), and/or lasers may be used for the various heat sources described herein.

The upper and lower windows 116, 115 may be transparent to the infrared radiation, such as by transmitting at least 95% of infrared radiation. The upper and lower windows 116, 115 may be a quartz material (such as a transparent quartz). In one or more embodiments, the upper window 116 includes an inner window 193 and outer window supports 194. The inner window 193 may be a thin quartz window that partially defines the processing volume 124. The outer window supports 194 support the inner window 193 and are at least partially disposed within a support groove. In one or more embodiments, the lower window 115 includes an inner window 187 and outer window supports 188. The inner window 187 may be a thin quartz window that partially defines the processing volume 124. The outer window supports 188 support the inner window 187.

The processing apparatus 100 includes a pedestal assembly 119 disposed in the processing volume 124. One or more liners 120 are disposed in the processing volume 124 and surround the pedestal assembly 119. The one or more liners 120 facilitate shielding the chamber body 130 from processing chemistry in the processing volume 124. The chamber body 130 is disposed at least partially between the upper window 116 and the lower window 115. The one or more liners 120 are disposed between the processing volume 124 and the chamber body 130.

The processing apparatus 100 includes a plurality of gas inject passages 182 formed in the chamber body 130 and in fluid communication with the processing volume 124, and one or more gas exhaust passages 172 (a plurality is shown in FIG. 1A) formed in the chamber body 130 opposite the plurality of gas inject passages 182. The one or more gas exhaust passages 172 are in fluid communication with the processing volume 124. Each of the plurality of gas inject passages 182 and one or more gas exhaust passages 172 are formed through one or more sidewalls of the chamber body 130 and through one or more liners 120 that line the one or more sidewalls of the chamber body 130.

Each gas inject passage 182 includes a gas channel 185 formed in the chamber body 130 and one or more gas openings 186 (two and three are shown in FIG. 1A) formed in the one or more liners 120. One or more supply conduit systems are in fluid communication with the gas inject passages 182. In FIG. 1A, an inner supply conduit system 121 and an outer supply conduit system 122 are in fluid communication with the gas inject passages 182. The inner supply conduit system 121 includes a plurality of inner gas boxes 123 mounted to the chamber body 130 and in fluid communication with an inner set of the gas inject passages 182. The outer supply conduit system 122 includes a plurality of outer gas boxes 117 mounted to the chamber body 130 and in fluid communication with an outer set of the gas inject passages 182.

The processing apparatus 100 includes a flow guide structure 150 positioned in the processing volume 124. The flow guide structure 150 includes one or more first flow dividers 151 (three are shown in FIG. 1A) that divide the processing volume into a plurality of flow levels 153 (four flow levels are shown in FIG. 1A). The flow guide structure 150 includes one or more second flow dividers 152 oriented to intersect the one or more first flow dividers 151 and divide each flow level 153 of the plurality of flow levels 153 into a plurality of flow sections 154 (two flow sections 154 are shown for each flow level 153 in FIG. 1A). In the implementation shown in FIG. 1A, the first flow dividers 151 each include a ring, and the one or more second flow dividers 152 each include a cylindrical sleeve that surrounds an innermost flow section 154 of the flow sections 154. The one or more first flow dividers 151 are coupled to the one or more liners 120.

The plurality of gas inject passages are 182 positioned as a plurality of inject levels such that each gas inject passage 182 corresponds to one of the plurality of inject levels. Each inject level aligns with a respective flow level 153. The gas inject passages 182 of each inject level are open to an outermost flow section 154 of the respective flow level. In the implementation shown in FIG. 1A, two or three of the gas openings 186 are grouped into each flow level, and the gas openings 186 are open to the outermost flow section 154 of the respective flow level.

The processing apparatus 100 includes a heat shield structure 1060 positioned in the processing volume 124. The heat shield structure 1060 includes a first shield plate 161 positioned inwardly of the one or more second flow dividers 152, and a second shield plate 1062. The second shield plate 1062 is oriented to intersect the first shield plate 161 and is supported at least partially by the one or more liners 120. The first shield plate 161 can be a cylindrical sleeve.

Each of the one or more second flow dividers 152 includes a plurality of divider inlet openings 155 and a plurality of divider outlet openings 156 formed therein. The divider outlet openings 156 are opposite of the divider inlet openings 155. As shown in FIG. 1A, two or three of the divider inlet openings 155 and two or three of the divider outlet openings 156 are grouped into a respective flow level 153 of the flow levels 153.

The first shield plate 161 includes a plurality of shield inlet openings 165 and a plurality of shield outlet openings 166 formed therein. The shield outlet openings 166 are opposite of the shield inlet openings 165. The plurality of divider inlet openings 155 are offset from the plurality of shield inlet openings 165 in the X-Y plane.

Each of the one or more liners 120, the one or more first flow dividers 151, the one or more second flow dividers 152, the first shield plate 161, and the second shield plate 1062 is formed of one or more of quartz, silicon carbide (SiC), or graphite coated with SiC).

The cassette 230 is positioned inwardly of the first shield plate 161. A pre-heat ring 111 is positioned outwardly of the cassette 230. The pre-heat ring 111 is coupled to and/or at least partially supported by the one or more liners 120. The one or more second flow dividers 152 are coupled to and/or at least partially supported by the pre-heat ring 111.

Portions of the flow guide structure 150 (such as the flow dividers 151) may act as a pre-heat ring for all flow sections 154 of each flow level 153. The pre-heat ring 111 may be part of (such as integrated with) the flow guide structure 150.

During operations (such as during an epitaxial deposition operation), one or more process gases P1 are supplied to the processing volume 124 through the inner supply conduit system 121 and the outer supply conduit system 122, and through the plurality of gas inject passages 182. The one or more process gases P1 are supplied from one or more gas sources 196 in fluid communication with the plurality of gas inject passages 182. Each of the gas inject passage 182 is configured to direct the one or more processing gases P1 in a generally radially inward direction towards the cassette 230. As such, in one or more embodiments, the gas inject passages 182 may be part of a cross-flow gas injector. The flow(s) of the one or more process gases P1 are divided into the plurality of flow levels 153. The division of process gas(es) into the plurality of flow levels 153 facilitates uniform processing (e.g., deposition) onto the substrates, center-to-edge uniformity, and process adjustability.

The processing apparatus 100 includes an exhaust conduit system 190. The one or more process gases P1 can be exhausted through exhaust gas openings formed in the one or more liners 120, exhaust gas channels formed in the chamber body 130, and then through exhaust gas boxes 1091. The one or more process gases P1 can flow from exhaust gas boxes 1091 and to an optional common exhaust box 1092, and then out through a conduit using one or more pump devices 197 (such as one or more vacuum pumps).

The one or more processing gases P1 can include, for example, purge gases, cleaning gases, and/or deposition gases. The deposition gases can include, for example, one or more reactant gases carried in one or more carrier gases.

Purge gas P2 supplied from a purge gas source 129 is introduced to the bottom region 105 of the processing volume 124 through one or more purge gas inlets 184 formed in the sidewall of the chamber body 130.

The one or more purge gas inlets 184 are disposed at an elevation below the gas inject passages 182. If the one or more liners 120 are used, a section of the one or more liners 120 may be disposed between the gas inject passages 182 and the one or more purge gas inlets 184. In either case, the one or more purge gas inlets 184 are configured to direct the purge gas P2 in a generally radially inward direction. The one or more purge gas inlets 184 may be configured to direct the purge gas P2 in an upward direction. During a film formation process, the pedestal assembly 119 is located at a position that can facilitate the purge gas P2 to flow generally along a flow path across a back side of the cassette 230. The purge gas P2 exits the bottom region 105 and is exhausted out of the processing apparatus 100 through one or more purge gas exhaust passages 102 located on the opposite side of the processing volume 124 relative to the one or more purge gas inlets 184.

The pedestal assembly 119 includes a first support frame 198 and a second support frame 199 disposed at least partially about the first support frame 198. The second support frame 199 includes arms coupled to the cassette 230 such that lifting and lowering the second support frame 199 lifts and lowers the cassette 230. A plurality of lift pins 189 are suspended from the cassette 230. Lowering of the cassette 230 initiates contact of the lift pins 189 with arms of the first support frame 198. Continued lowering of the cassette 230 initiates contact of the lift pins 189 with the substrates in the cassette 230 such that the lift pins 189 raise the substrates in the cassette 230. A bottom region 105 of the processing apparatus 100 is defined between the chamber body bottom 134 and the cassette 230. A stem 125 of each support frame 198, 199 extends through a bottom 134 of the chamber body 130. The stems 125 are coupled to a respective motor 164, which is configured to independently raise, lower, and/or rotate the cassette 230.

A pedestal bellows port 160 are formed in the bottom 134 of the chamber body 130. The pedestal bellows ports 160 extends through the bottom 134 of the chamber body 130. The pedestal bellows port 160 has a diameter larger than a diameter of the stem 125 and circumscribes each stem 125 where the stem 125 extends through the bottom 134 of the chamber body 130. The pedestal bellows port 160 circumferentially surround the stems 125. A bellows assembly 158 is disposed around each pedestal bellows port 160 to facilitate reduced or eliminated vacuum leakage outside the chamber body 130. Each of the bellows assemblies 158 circumscribe and enclose a portion of the stems 125 disposed outside the chamber body 130. The bellows assemblies 158 are coupled between an exterior surface of the bottom 134 of the chamber body 130 and a base member 180. The base member 180 may house the motor 164 and a portion of the stem 125, which is coupled to the motor 164. The bellows assembly 158 may be formed from a metallic or metallized material and be configured to form a gas flow channel 162. The gas flow channel 162 is defined as a region between the outer stem 125 and the bellows assembly 158. The gas flow channel 162 extends from the pedestal bellows port 160 to the base member 180. As such, the gas flow channel 162 forms a hollow cylindrically shaped passage between the bellows assembly 158 and the stem 125. The gas flow channel 162 is fluidly coupled between the bottom region 105 and an exhaust conduit, which may be used to pump (e.g., exhaust) gases from the bottom region 105 through the pedestal bellows port 160.

An opening 136 is formed through the one or more sidewalls of the chamber body 130. The opening 136 may be used to transfer the substrates 255 to or from the cassette 230, e.g., in and out of the processing volume 124. In one or more embodiments, the opening 136 includes a slit valve. In one or more embodiments, the opening 136 may be connected to any suitable valve that enables the passage of substrates therethrough. The opening 136 is shown in ghost in FIGS. 1A and 1B for visual clarity purposes.

The processing apparatus 100 may include one or more temperature sensors 191, 192, such as optical pyrometers, which measure temperatures within the processing apparatus 100 (such as on the surfaces of the upper window 116, one or more surfaces of the substrates 255 and/or the cassette 230). The one or more temperature sensors 191, 192 are disposed on the lid 104.

The processing apparatus 100 includes a controller 1070 configured to control the processing apparatus 100 or components thereof. For example, the controller 1070 may control the operation of components of the processing apparatus 100 using a direct control of the components or by controlling controllers associated with the components. In operation, the controller 1070 enables data collection and feedback from the respective chambers to coordinate and control performance of the processing apparatus 100.

The controller 1070 generally includes a central processing unit (CPU) 1071, a memory 1072, and support circuits 1073. The CPU 1071 may be one of any form of a general purpose processor that can be used in an industrial setting. The memory 1072, or non-transitory computer readable medium, is accessible by the CPU 1071 and may be one or more of memory such as random access memory (RAM), read only memory (ROM), floppy disk, hard disk, or any other form of digital storage, local or remote. The support circuits 1073 are coupled to the CPU 1071 and may include cache, clock circuits, input/output subsystems, power supplies, and the like.

The various methods (such as the method 1200) and operations disclosed herein may generally be implemented under the control of the CPU 1071 by the CPU 1071 executing computer instruction code stored in the memory 1072 (or in memory of a particular processing chamber) as, e.g., a software routine. When the computer instruction code is executed by the CPU 1071, the CPU 1071 controls the components of the processing chamber 100 to conduct operations in accordance with the various methods and operations described herein. In one embodiment, which can be combined with other embodiments, the memory 1072 (a non-transitory computer readable medium) includes instructions stored therein that, when executed, cause the methods (such as the method 1200) and operations (such as the operations 1201, 1202, 1204, 1206, 1207, 1208, 1210, 1212, 1213) described herein to be conducted. The controller 1070 can be in communication with the heat sources, the gas sources, and/or the vacuum pump(s) of the processing apparatus 100, for example, to cause a plurality of operations to be conducted.

FIG. 1B is a schematic cross-sectional side view of the processing apparatus 100 shown in FIG. 1A, according to one implementation. The cross-sectional view shown in FIG. 1B is rotated by 90 degrees relative to the cross-sectional view shown in FIG. 1A.

The processing apparatus 100 includes one or more side radiant heat sources 118*a*, 118*b* (e.g., side lamps, side resistive heaters, side LEDs, and/or side lasers, for example) positioned outwardly of the processing volume 124. One or more second side heat sources 118*b* are opposite one or more first side heat sources 118*a* across the processing volume 124.

In FIG. 1B, the flow guide structure 150 and the heat shield structure 1060 are not shown for visual clarity purposes. Additionally, the present disclosure contemplates that the flow guide structure 150 and/or the heat shield structure 1060 can be omitted from the processing apparatus 100 shown in FIGS. 1A and 1B. In such an implementation, the one or more process gases P1 flow into an outer annulus of the processing volume 124 from the gas inject passages 182, and then flow into the inlet openings 234 (described below and identified in FIG. 2) of the cassette 230. The one or more processing gases P1 flow from the outlet openings 235 (described below and identified in FIG. 2), into the outer annulus of the processing volume 124, and into the one or more gas exhaust passages 172. The present disclosure also contemplates that a plurality of lines (such as conduits) in the processing volume 124 can connect each of the gas inject passages 182 to each of the inlet openings 234 (identified in FIG. 2) of the cassette 230.

Figure 2:
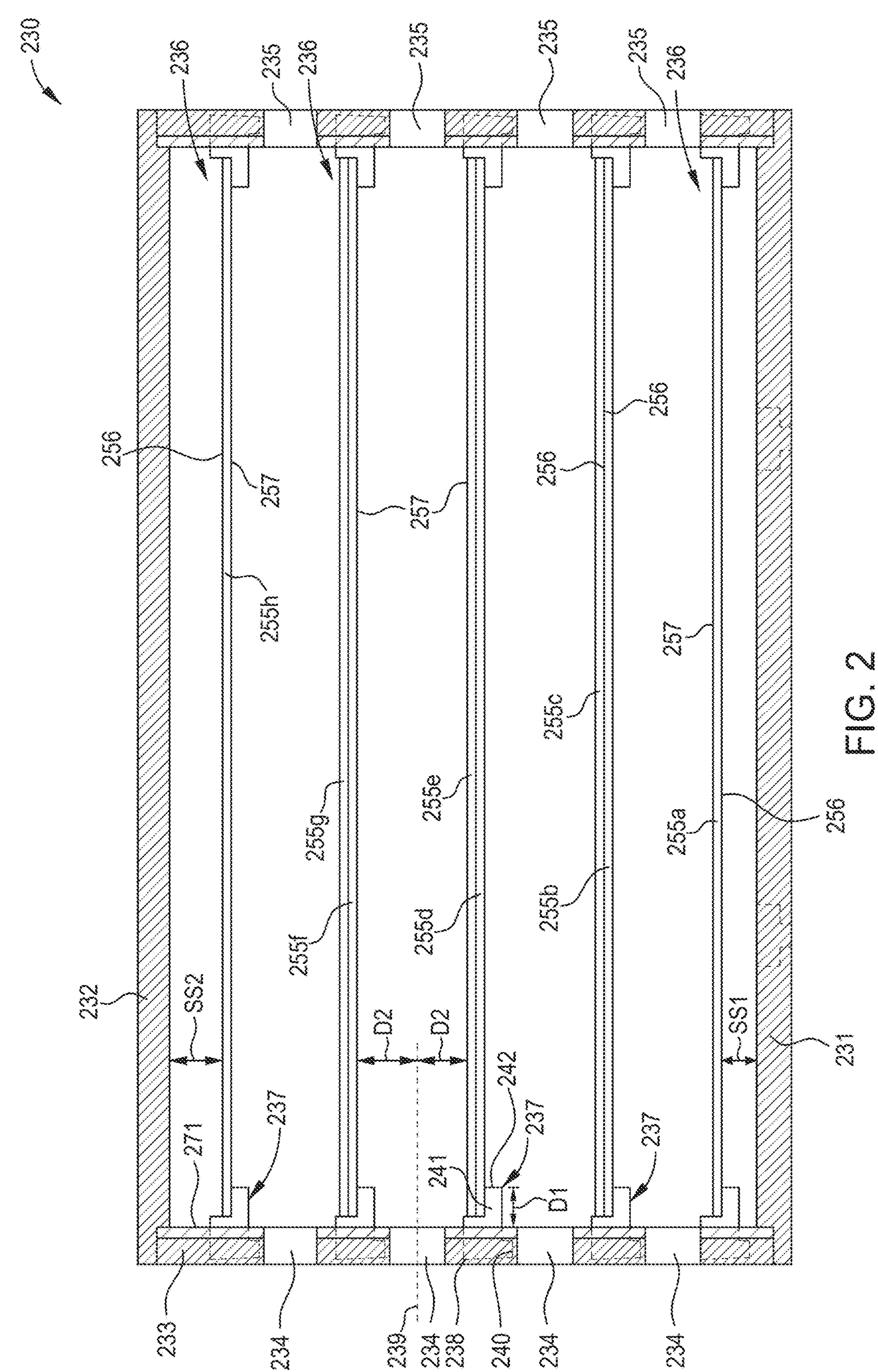
FIG. 2 is a schematic side cross-sectional view of the cassette shown in FIGS. 1A and 1B, according to one implementation.

FIG. 2 is a schematic side cross-sectional view of the cassette 230 shown in FIGS. 1A and 1B, according to one implementation. The view in FIG. 2 can be taken, for example, along Section 2-2 shown in FIG. 6.

The cassette 230 includes a first wall 231 (e.g., a lower wall), a second wall 232 (e.g., an upper wall) spaced from the first wall 231, and one or more sidewalls 233 extending between and coupled to the first wall 231 and the second wall 232. In one or more embodiments, each of the one or more sidewalls 233 is formed of one or more of silicon carbide (SiC), quartz (such as opaque quartz), and/or graphite coated with SiC. In one or more embodiments, each of the first wall 231 and/or the second wall 232 is formed of one or more of silicon carbide (SiC), quartz (such as opaque quartz), and/or graphite coated with SiC.

The cassette 230 includes one or more inlet openings 234 formed in the one or more sidewalls 233, and one or more outlet openings 235 formed in the one or more sidewalls 233 opposite the one or more inlet openings 234. The cassette 230 includes a plurality of levels 236 that have a plurality of substrate supports 237 mounted to the one or more sidewalls 233 and spaced from each other along the one or more sidewalls 233. Five levels 236 are shown in the implementation of FIG. 2. The present disclosure contemplates that a variety of numbers of levels 236 may be used, such as two levels, three levels, or six to twelve (or more) levels.

Figure 4:
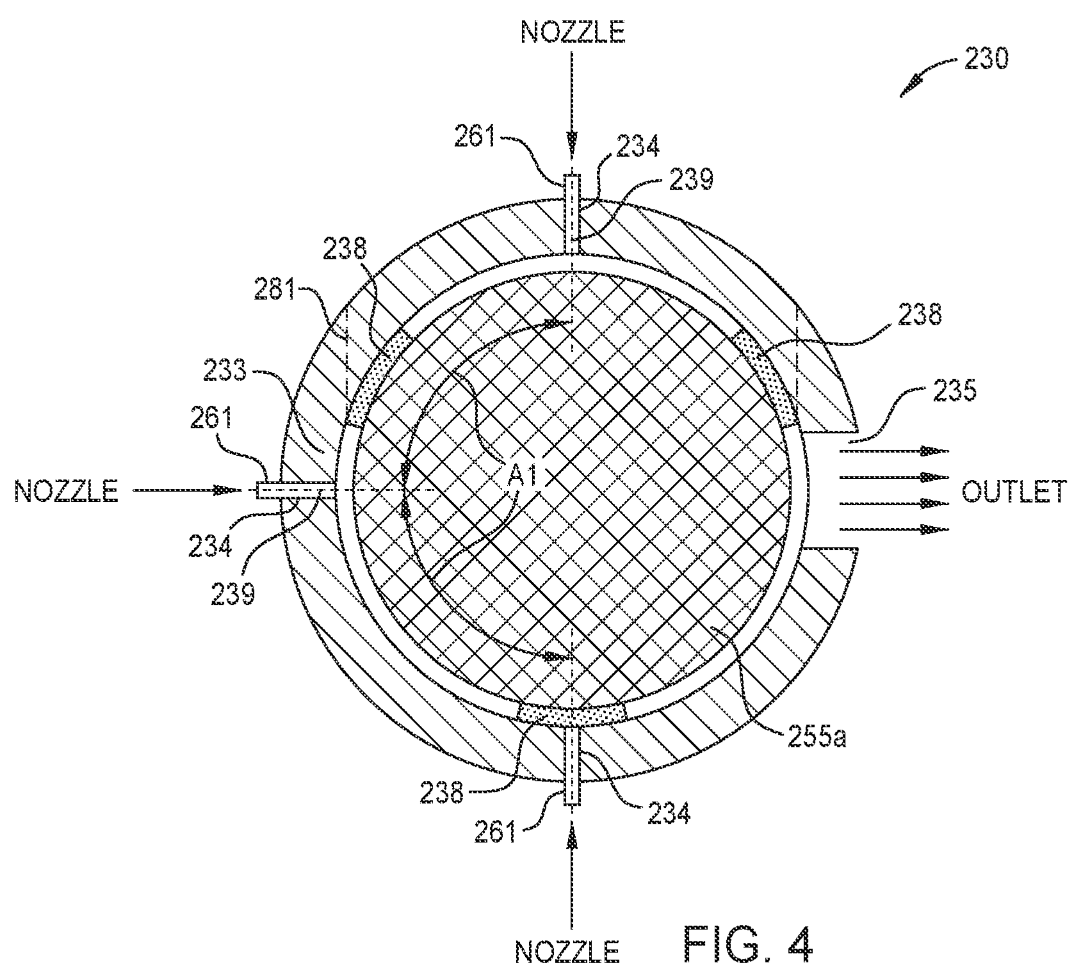
FIG. 4 is a schematic top cross-sectional view of the cassette shown in FIGS. 2 and 3, according to one implementation.

Each substrate support 237 of each level 236 includes one or more arcuate ring segments 238 (see FIG. 4). In one or more embodiments, the one or more arcuate ring segments 238 include a plurality of arcuate ring segments 238 spaced circumferentially from each other along the one or more sidewalls 233 (see FIG. 4). Each of the plurality of arcuate ring segments 238 includes an outer ledge 240 that extends into the one or more sidewalls 233, and an inner ledge 241. Portions (such as the outer ledges 240) of the arcuate ring segments 238 that extend into the one or more sidewalls 233 are shown in ghost in FIG. 2.

The outer ledges 240 facilitate mounting the substrate supports 237 to the one or more sidewalls 233. In one or more embodiments, the outer ledges 240 are L-shaped and are received in L-shaped slots formed in the one or more sidewalls 233. The inner ledges 241 facilitate supporting a plurality of substrates 255*a*-255*h*. In the implementation shown in FIG. 2, the cassette 230 supports eight substrates 255*a*-255*h* during simultaneous deposition (e.g., epitaxial deposition) of one or more layers onto each substrate. A first outer substrate 255*a* is supported on a lowermost substrate support 237, and a second outer substrate 255*h* is supported on an uppermost substrate support 237. Sets of two middle substrates 255*b*-255*g* are supported on respective substrate supports 237 in a stacked configuration such that outer surfaces 256 of the two middle substrates in each set directly contact each other. The outer surfaces 256 are backside surfaces that oppose deposition surfaces 257 on which one or more layers are formed (e.g., epitaxially grown) during a deposition operation. For the first outer substrate 255*a* and the second outer substrate 255*h*, the backside surfaces 256 face the first wall 231 and the second wall 232 of the cassette 230, respectively.

The cassette 230 includes a reflective surface 271 on an inner face of each of the one or more sidewalls 233. The reflective surface 271 has a reflectivity within a range of 0.3 to 0.9999. The reflective surface 271 facilitates reflecting heat (such as light) back toward the substrates 255*a*-255*h* during a deposition operation to facilitate heating efficiency and maintaining the substrates at a processing temperature uniformly over processing surfaces of the substrates. In one or more embodiments, the reflective surface 271 is a roughened surface of the one or more sidewalls 233. A surface roughness of the roughened surface can be specified to balance reduced particle generation with increased heat transfer (e.g., involving emissivity) of the reflective surface 271. In one or more embodiments, the reflective surface 271 is part of a liner formed of gold (Au) or quartz. In one or more embodiments, the reflective surface 271 is part of a reflective coating formed on the one or more sidewalls 233.

The inner ledge 241 of each substrate support 237 has an inward end 242 that extends past the reflective surface 271 by a distance D1 that is 10.0 mm or less, such as 5.0 mm or less. The distance D1 facilitates supporting the respective substrates 255*a*-255*h* while facilitating increased deposition or etch coverage of layers on the substrates.

Figure 3:
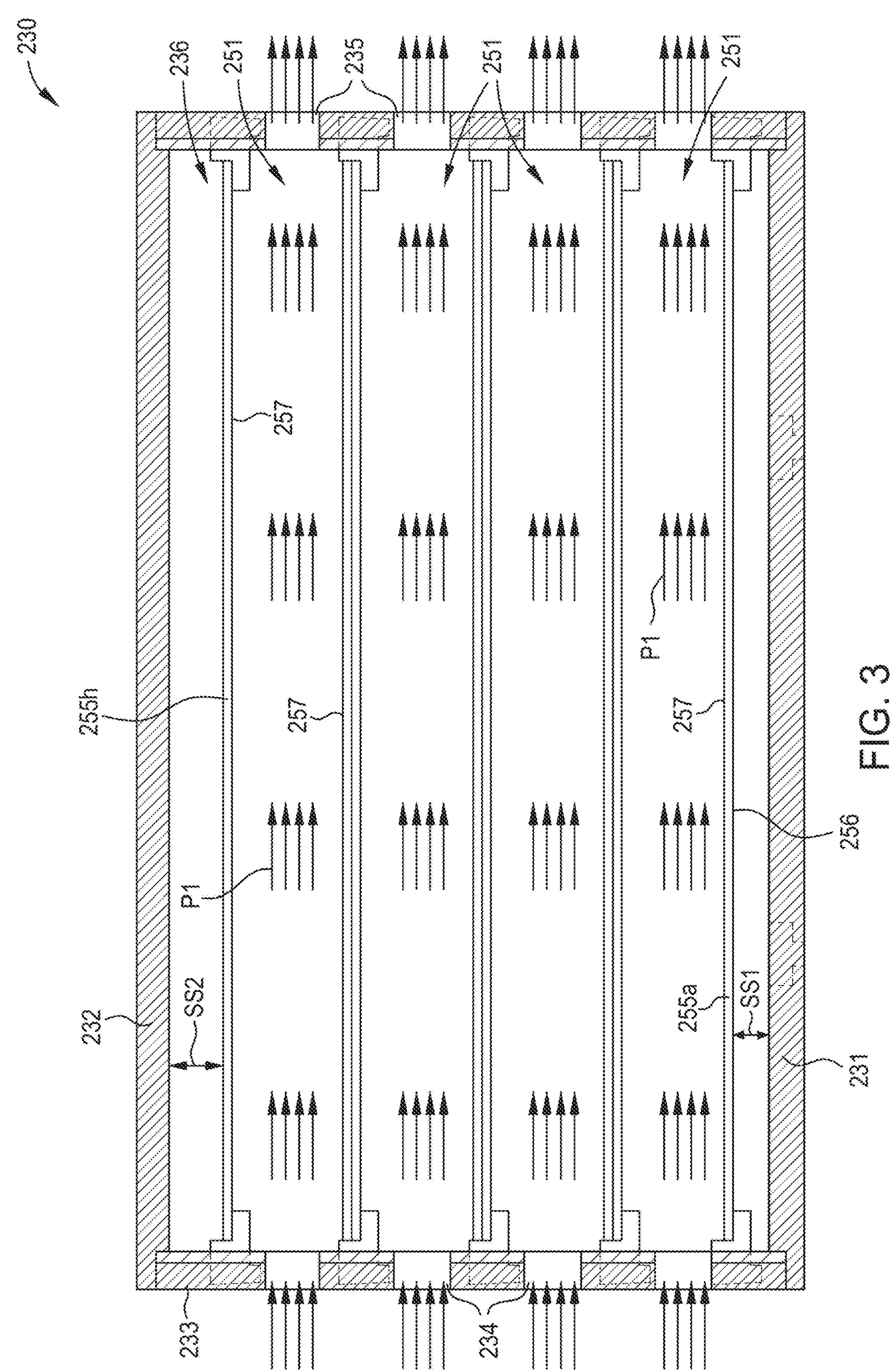
FIG. 3 is a schematic side cross-sectional view of the cassette shown in FIG. 2 during a deposition operation, according to one implementation.

FIG. 3 is a schematic side cross-sectional view of the cassette 230 shown in FIG. 2 during a deposition operation, according to one implementation.

Each of the one or more inlet openings 234 and each of the one or more outlet openings 235 is aligned between two of the plurality of substrate supports 237. The one or more inlet openings 234 and the one or more outlet openings 235 are positioned as a plurality of flow levels 251 (four flow levels 251 are shown in FIG. 3). For each flow level 251, one or more process gases P1 flow between the deposition surfaces 257 of two of the substrates 255*a*-255*h*. Each flow level 251 of the plurality of flow levels 251 of the cassette 230 is aligned with and in fluid communication with a respective inject level of the plurality of inject levels of the gas inject passages 182 (see FIG. 1A). Each flow level 251 of the plurality of flow levels 251 of the cassette 230 is aligned with and in fluid communication with a respective flow level 153 of the plurality of flow levels 153 of the flow guide structure 150 (see FIG. 1A).

The cassette 230 facilitates reducing or eliminating deposition on the backside surfaces 256 of the substrates 255*a*-255*h* during the deposition operation.

The subject matter described herein (such as the cassette 230) facilitate increased throughput, efficient use of gases, reduced costs, and modularity in applications (such as for one-sided deposition applications) while facilitating maintained or enhanced growth rates and maintained or enhanced device performance.

The lowermost substrate 255*a* is spaced from the first wall 231 by a first wall spacing SS1, and the uppermost substrate 255*h* is spaced from the second wall 232 by a second wall spacing SS2. In one or more embodiments, a single substrate 255*a*, 255*h* is supported on each of the lowermost level 236 and the uppermost level 236 if the wall spacings SS1, SS2 are less than the distance D2 described below. FIG. 4 is a schematic top cross-sectional view of the cassette 230 shown in FIGS. 2 and 3, according to one implementation. FIG. 4 shows a single flow level 251 of the plurality of flow levels 251. In the implementation shown in FIG. 4, for each flow level 251 the one or more inlet openings 234 include a plurality of inlet openings 234 (three inlet openings 234 are shown for each flow level 251 in FIG. 5) spaced from each other circumferentially along the one or more sidewalls 233 by an angle A1. The angle A1 is between centerline axes 239 of the inlet openings 234. In one or more embodiments, the angle A1 is within a range of 20 degrees to 120 degrees (such as 20 degrees, 45 degrees, 60 degrees, 90 degrees, or 120 degrees), for example within a range of 20 degrees to 90 degrees. In one or more embodiments, each inlet opening 234 includes a nozzle 261 in fluid communication with and/or inserted at least partially into the respective inlet opening 234. The present disclosure contemplates that, where each nozzle 261 is shown, a series of nozzles may be used. In one or more embodiments, the inlet openings 234 each have a cross-sectional shape that is circular or ovular.

The present disclosure contemplates that, as is shown in FIG. 4, a single outlet opening 235 can be used for each flow level 251 of the plurality of flow levels 251.

In one or more embodiments, the cassette 230 includes a gap 281 (shown in ghost in FIG. 4 for visual clarity purposes) formed in the one or more sidewalls 233. The substrates 255 can be transported into and out of the cassette 230 through the gap 281.

Figure 5:
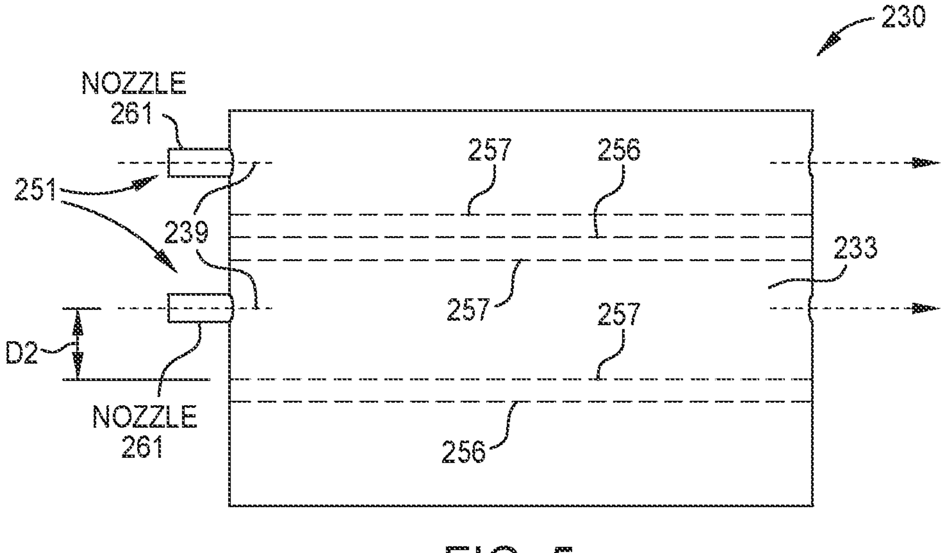
FIG. 5 is a schematic partial side view of the cassette shown in FIGS. 2-4, according to one implementation.

FIG. 5 is a schematic partial side view of the cassette 230 shown in FIGS. 2-4, according to one implementation.

Each of the one or more inlet openings 234 and/or the one or more outlet openings 235 is aligned such that each centerline axis 239 is aligned at a distance D2 from each of the two adjacent deposition surfaces 257 of the substrates 255*a*-255*h*. In one or more embodiments, the distance D2 is 0.5 mm or higher, such as within a range of 0.5 mm to 20 mm. In one or more embodiments, the distance D2 is 10.0 mm. The present disclosure contemplates other values for the distance D2, which can depend on process conditions used, uniformity used, growth rate used, and/or etch rate used.

Figure 6:
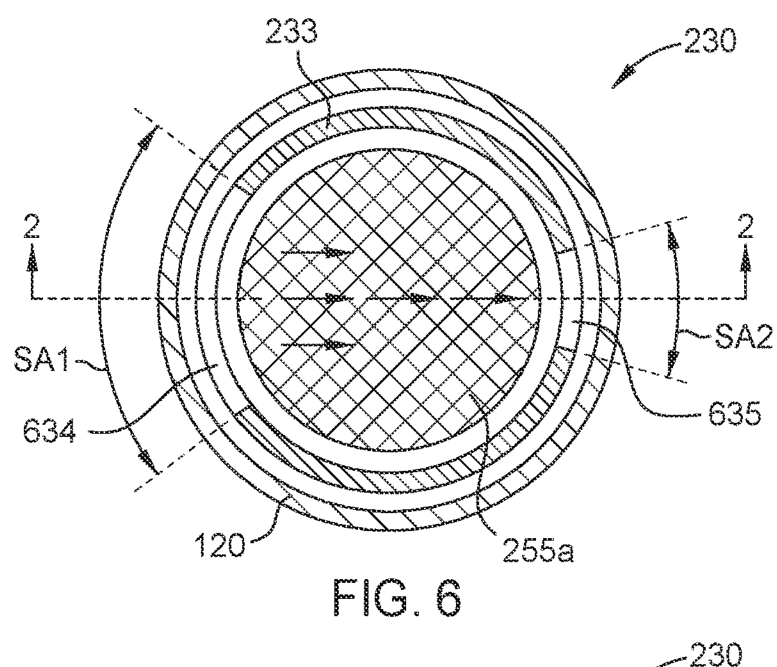
FIG. 6 is a schematic top cross-sectional view of the cassette shown in FIGS. 2 and 3, according to one implementation.

FIG. 6 is a schematic top cross-sectional view of the cassette 230 shown in FIGS. 2 and 3, according to one implementation. FIG. 6 shows a single flow level 251 of the plurality of flow levels 251. In the implementation shown in FIG. 6, for each flow level 251 the one or more inlet openings include one or more slots 634 that extend circumferentially along the one or more sidewalls 233 by a slot angle SA1. In one or more embodiments, the slot angle SA1 is 20 degrees or larger, such as 30 degrees or larger, for example 45 degrees or 60 degrees. In one or more embodiments, the slot angle SA1 is within a range of 20 degrees to 120 degrees, such as within a range of 60 degrees to 120 degrees. In one or more embodiments, for each flow level 251 the one or more outlet openings include one or more slots 635 that extend circumferentially along the one or more sidewalls by a second slot angle SA2. In one or more embodiments, the second slot angle SA2 is less than the slot angle SA1. The present disclosure contemplates that the second slot angle SA2 can be equal to or greater than the slot angle SA1.

Figure 7:
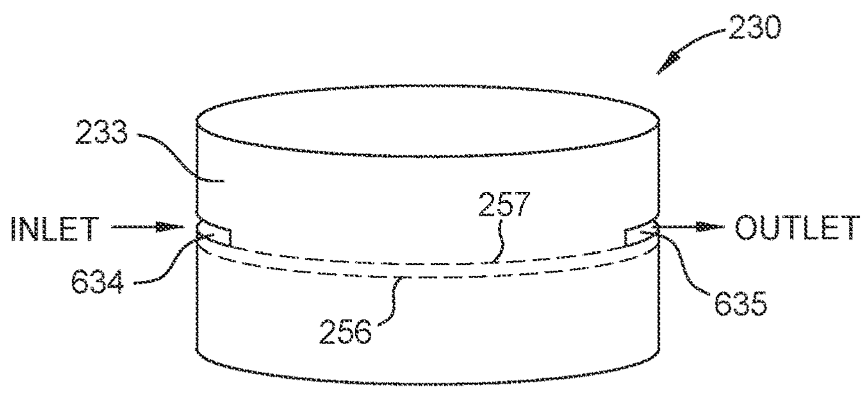
FIG. 7 is a schematic partial perspective view of the cassette shown in FIG. 6, according to one implementation.

FIG. 7 is a schematic partial perspective view of the cassette 230 shown in FIG. 6, according to one implementation.

Figure 8:
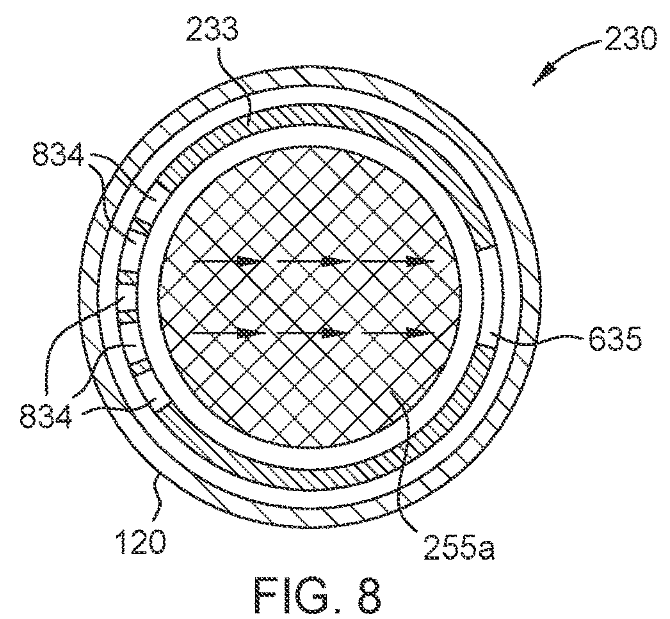
FIG. 8 is a schematic top cross-sectional view of the cassette shown in FIGS. 2 and 3, according to one implementation.

FIG. 8 is a schematic top cross-sectional view of the cassette 230 shown in FIGS. 2 and 3, according to one implementation. FIG. 8 shows a single flow level 251 of the plurality of flow levels 251.

In the implementation shown in FIG. 8, for each flow level 251 the one or more inlet openings include a plurality of more slots 834 that each extend circumferentially along the one or more sidewalls 233. The slots 834 are spaced from each other circumferentially along the one or more sidewalls 233.

Although not shown in FIGS. 5-8 for visual clarity purposes, the implementations in FIGS. 5-8 can include one or more arcuate ring segments 238 (for example, as shown in FIG. 4).

Figures 9, 10, 11:
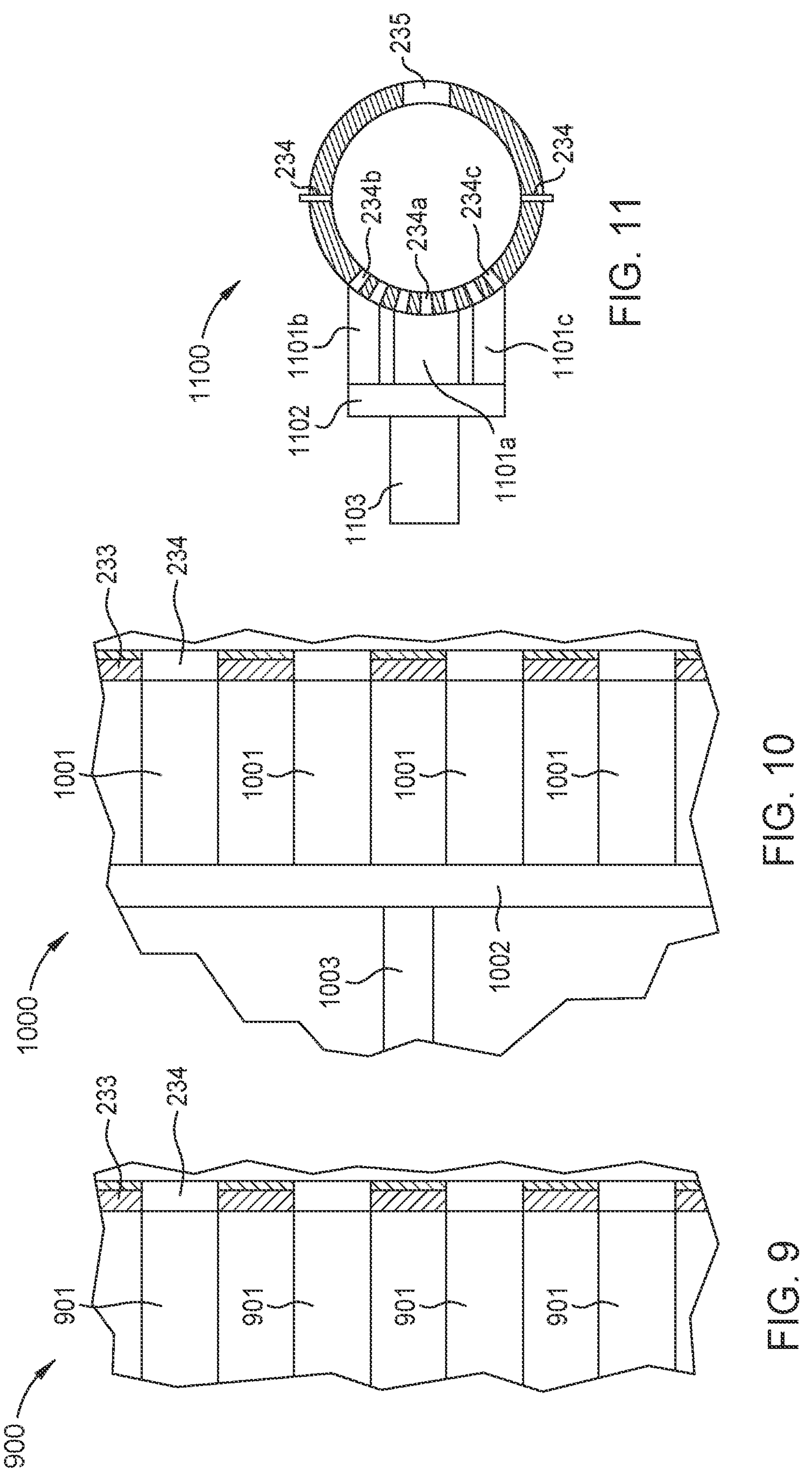
FIG. 9 is a schematic enlarged view of the cassette shown in FIG. 2, according to one implementation.
FIG. 10 is a schematic enlarged view of the cassette shown in FIG. 2, according to one implementation.
FIG. 11 is a schematic top cross-sectional view of the cassette shown in FIGS. 2 and 3, according to one implementation.

FIG. 9 is a schematic enlarged view of the cassette 230 shown in FIG. 2, according to one implementation. A gas injection assembly 900 includes a plurality of lines 901 (such as conduits). Each line 901 is connected to one of the inlet openings 234. Each line 901 may extending between one of the inlet openings 234 and one of the gas inject passages 182. The present disclosure contemplates that each line 901 can be connected to or integrated with one of the nozzles 261 (if used).

FIG. 10 is a schematic enlarged view of the cassette 230 shown in FIG. 2, according to one implementation. A gas injection assembly 1000 includes a plurality of lines 1001 (such as conduits). Each line 1001 is connected to one of the inlet openings 234. Each line 1001 is connected to a common distribution box 1002, which is connected to a common supply line 1003. The common distribution box 1002 can include a common supply plenum. The present disclosure contemplates that each line 1001 can be connected to or integrated with one of the nozzles 261 (if used).

FIG. 11 is a schematic top cross-sectional view of the cassette 230 shown in FIGS. 2 and 3, according to one implementation. FIG. 11 shows a single flow level 251 of the plurality of flow levels 251. The implementation shown in FIG. 11 is similar to the implementation shown in FIG. 4, and may include one or more features, aspects, components, operations, and/or properties thereof.

A gas injection assembly 1100 includes a plurality of lines 1101 (such as conduits). The inlet openings 234 includes one or more central openings 234*a* connected to a first line 1101*a*, one or more first outer openings 234*b* connected to a second line 1101*b*, and one or more second outer openings 234*c* connected to a third line 1101*c*. Each line 1101 is connected to a common distribution box 1102, which is connected to a common supply line 1103. The common distribution box 1102 can include a common supply plenum. The gas flow in each line 1101 may or may not be controlled independently to achieve a specific uniformity in deposition or etching.

Figure 12:
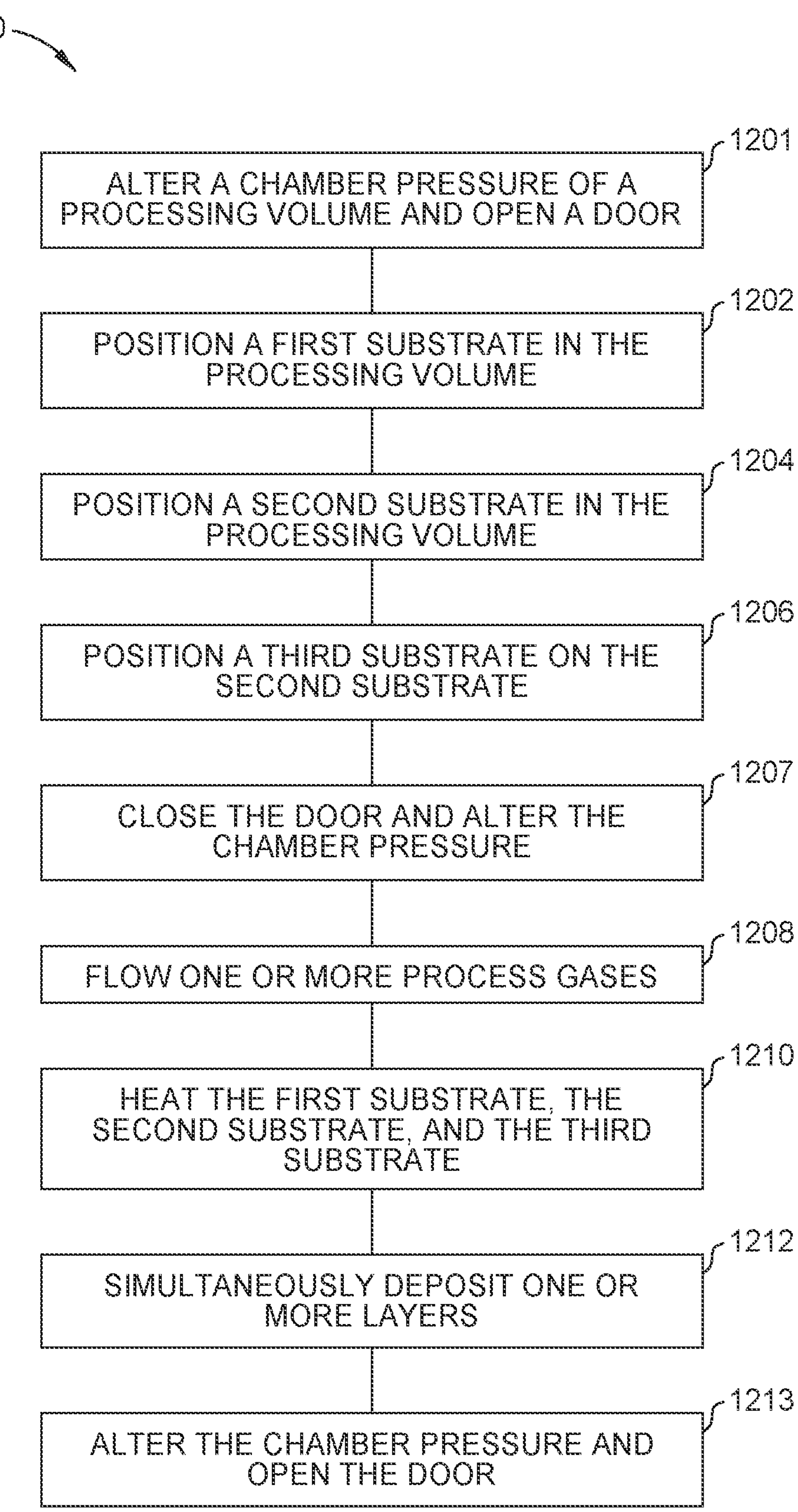
FIG. 12 is a schematic diagram view of a method of processing a plurality of substrates.

FIG. 12 is a schematic diagram view of a method 1200 of processing a plurality of substrates.

Operation 1201 of the method 1200 includes altering a chamber pressure of a processing volume in a chamber, and then opening a door of the chamber. In one or more embodiments, the chamber pressure is altered to be substantially equal to or above a reference pressure. In one or more embodiments, the reference pressure is a pressure of a transfer chamber and/or a load lock chamber. The door can include, for example, a slit valve.

Operation 1202 includes positioning a first substrate in the processing volume. In one or more embodiments, the positioning of the first substrate includes extending the first substrate through a gap formed in one or more sidewalls of a cassette.

The present disclosure contemplates that an additional substrate (such as the substrate 255*j* shown in FIGS. 13 and 14) can be positioned on the first substrate (such as the substrate 255*a* shown in FIGS. 13 and 14) prior to operation 1204.

Operation 1204 includes positioning a second substrate in the processing volume at a substrate spacing from the first substrate and/or a substrate spacing from the additional substrate (if used).

Operation 1206 includes positioning a third substrate on the second substrate such that an outer surface of the third substrate contacts an outer surface of the second substrate. In one or more embodiments, the first substrate is positioned to be supported on a first substrate support, and the second substrate and the third substrate are positioned to be supported on a second substrate support that is spaced from the first substrate support.

Operation 1207 includes (after all the substrates are positioned in the processing volume) closing the door and altering the chamber pressure to be at a process pressure used for deposition. In one or more embodiments, the process pressure is lower than the reference pressure.

Operation 1208 includes flowing one or more process gases into the processing volume. In one or more embodiments, the flowing of the one or more process gases includes flowing the one or more process gases through a first flow path between the first substrate and the second substrate and a second flow path outwardly of the third substrate.

Operation 1210 includes heating the first substrate, the second substrate, and the third substrate.

Operation 1212 includes simultaneously depositing one or more layers on each of the first substrate the second substrate, and the third substrate while the third substrate is contacting the second substrate.

Operation 1213 includes altering the chamber pressure and then opening the door such that all of the substrates can be removed from the processing volume. In one or more embodiments, the chamber pressure is altered to be substantially equal to or above the reference pressure.

Figure 13:
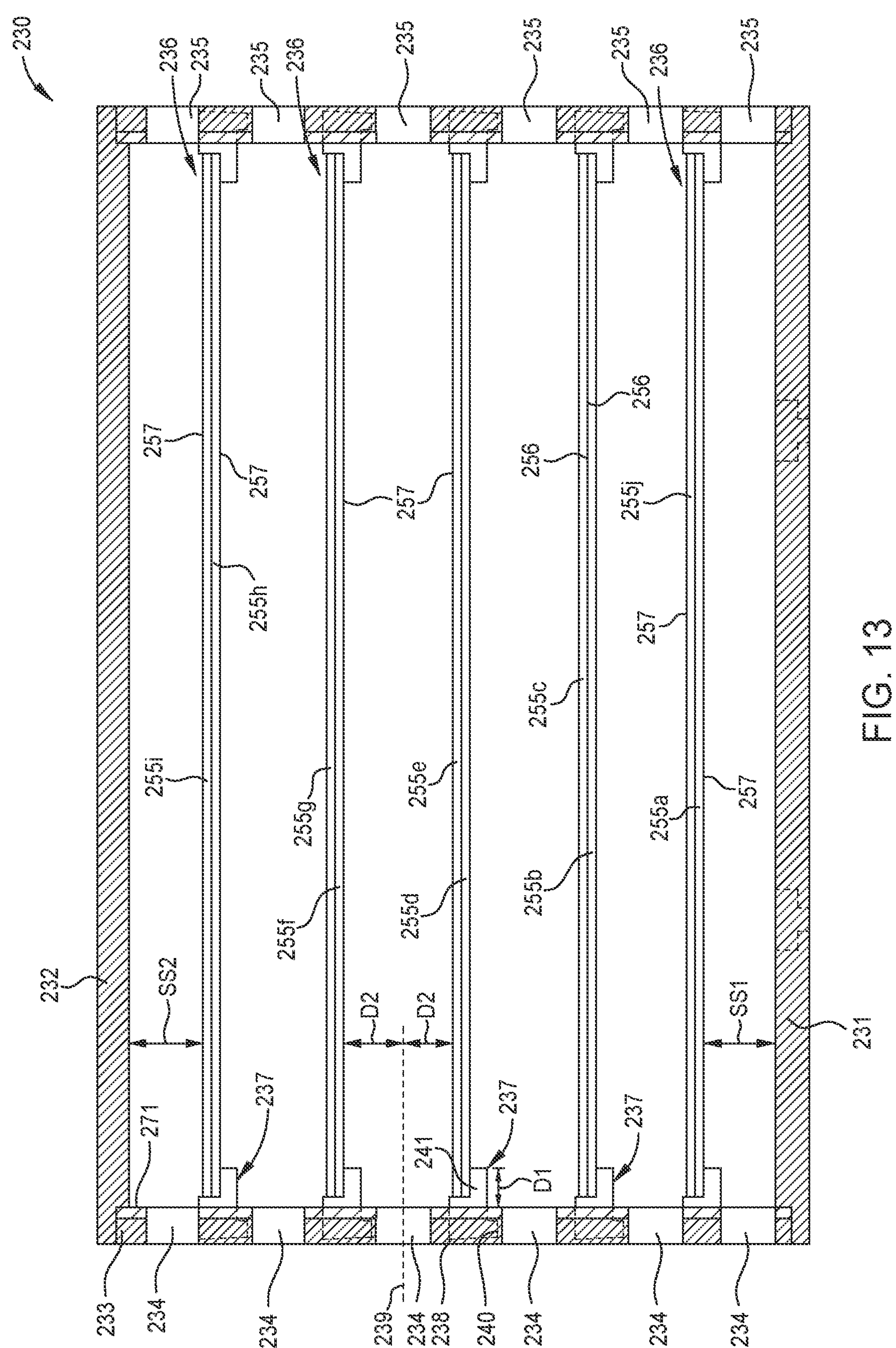
FIG. 13 is a schematic side cross-sectional view of the cassette shown in FIGS. 1A and 1B, according to one implementation.

FIG. 13 is a schematic side cross-sectional view of the cassette 230 shown in FIGS. 1A and 1B, according to one implementation.

Figure 14:
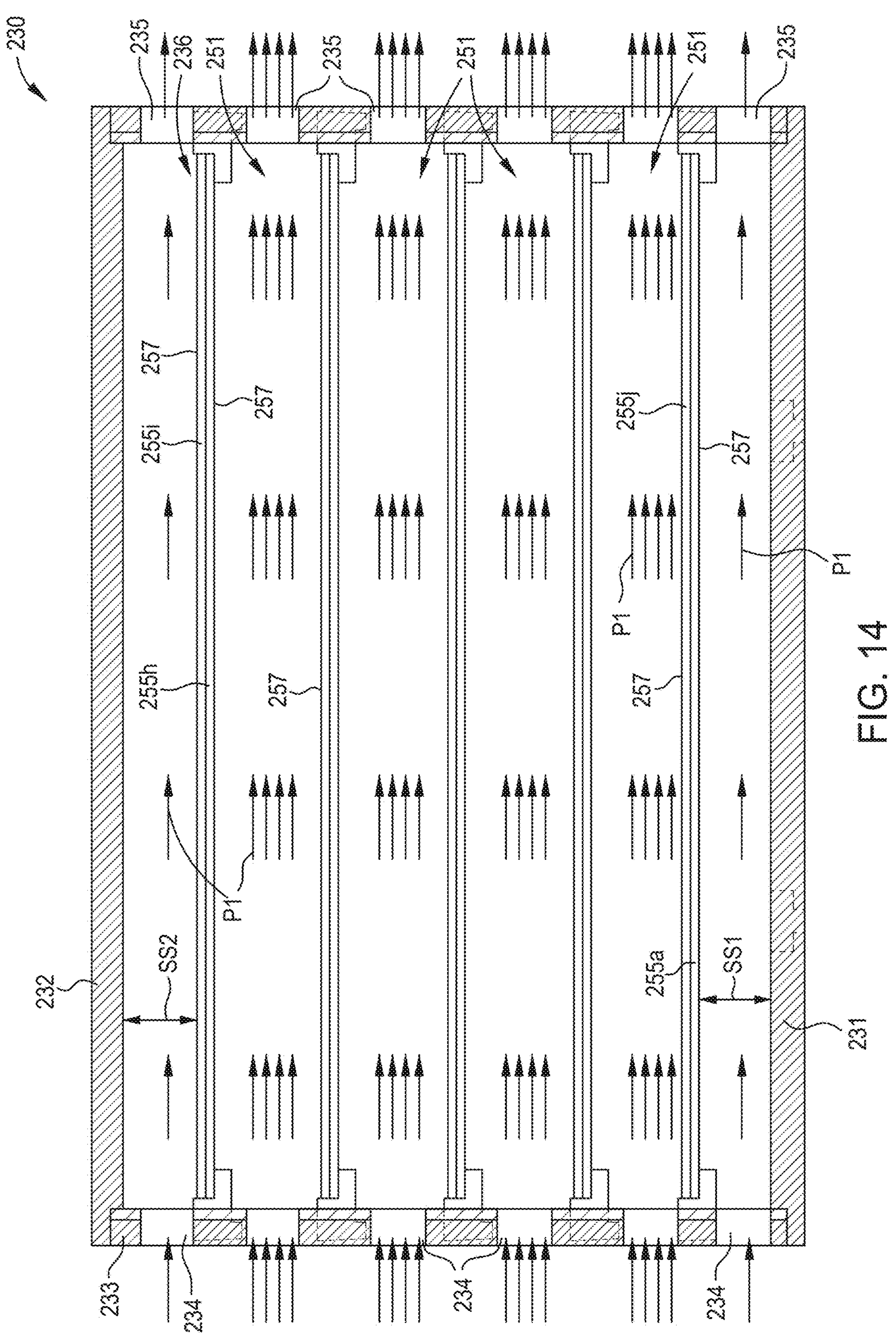
FIG. 14 is a schematic side cross-sectional view of the cassette shown in FIG. 13 during a deposition operation, according to one implementation.

FIG. 14 is a schematic side cross-sectional view of the cassette 230 shown in FIG. 13 during a deposition operation, according to one implementation.

In the implementation shown in FIGS. 13 and 14, the first wall spacing SS1 and the second wall spacing SS2 are equal to the distance D2. In such an implementation, additional substrates 255*i*, 255*j* are stacked respectively on the substrates 255*a*, 255*h* such that each and every level 236 supports two substrates. In the implementation shown in FIGS. 13 and 14, the cassette 230 supports ten substrates

255*a*-255*j*, and the substrate 255*i* is the second outer substrate (instead of the substrate 255*h*).

Benefits of the present disclosure include increased throughput, efficient use of gases, reduced costs, reduced processing times, increased chamber capacity, increased growth rates of deposited films, enhanced device performance, more uniform device performance across a plurality of substrates, more uniform and stable thermal processing across a plurality of substrates, and reduced dimensions and footprint (e.g., of chambers). Benefits also include uniform adjustability, such as processing temperature control and adjustability, gas parameter control and adjustability, and substrate center-to-edge control and adjustability. As an example, such benefits are facilitated in relatively complex operations, such as operations that call for one-sided deposition (e.g., reduced or eliminated deposition on backside surfaces of substrates).

Benefits also include enhanced device performance and modularity in application. As an example, batch processing can be used for relatively complex epitaxial deposition operations at relatively smaller footprints, relatively larger throughputs, while maintaining or enhancing growth rates and maintaining or enhancing device performance. Such benefits of the present application are facilitated by implementations of the present disclosure.

It is contemplated that aspects described herein can be combined. For example, one or more features, aspects, components, operations, and/or properties of the processing apparatus 100, the cassette 230, the gas injection assembly 900, the gas injection assembly 1000, the gas injection assembly 1100, and/or the method 1200 can be combined. It is further contemplated that any combination(s) can achieve the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. A cassette configured for disposition in a substrate processing chamber, comprising:

- a first wall;
- a second wall spaced from the first wall;
- one or more sidewalls extending between and coupled to the first wall and the second wall;
- one or more inlet openings formed in the one or more sidewalls;
- one or more outlet openings formed in the one or more sidewalls opposite the one or more inlet openings; and
- a plurality of levels comprising a plurality of substrate supports mounted to the one or more sidewalls and spaced from each other along the one or more sidewalls, the one or more sidewalls defining a sleeve that surrounds by more than 180 degrees the plurality of substrate supports disposed in an internal volume, and the plurality of substrate supports comprising:
  - a plurality of arcuate ring segments respectively comprising:
    - an outer ledge that extends into the one or more sidewalls, and
    - an inner ledge that extends inwardly relative to the one or more sidewalls.

2. The cassette of claim 1, wherein the outer ledge defines a shoulder interfacing with a recessed surface and a shoulder of the one or more sidewalls.

3. The cassette of claim 1, further comprising a reflective surface on an inner face of each of the one or more sidewalls.

4. The cassette of claim 3, wherein the inner ledge has an inward end that extends past the reflective surface by a distance that is 10.00 mm or less.

5. The cassette of claim 3, wherein the reflective surface is a roughened surface of the one or more sidewalls.

6. The cassette of claim 5, wherein the reflective surface is part of a liner formed of gold (Au) or quartz.

7. The cassette of claim 1, wherein the reflective surface has a reflectivity within a range of 0.3 to 0.9999.

8. The cassette of claim 1, further comprising a gap formed in the one or more sidewalls, the gap sized and shaped for substrate transfer.

9. The cassette of claim 1, wherein the one or more outlet openings include an outlet opening that spans the plurality of levels.

10. The cassette of claim 1, wherein each of the one or more sidewalls is formed of one or more of silicon carbide (SiC), quartz, or graphite coated with SiC.

11. The cassette of claim 1, wherein each substrate support of each level of the plurality of levels comprises one or more arcuate ring segments of the plurality of arcuate ring segments.

12. The cassette of claim 11, wherein the plurality of arcuate ring segments of the respective level are spaced circumferentially from each other along the one or more sidewalls.

13. The cassette of claim 1, wherein the inner ledge having has an inward end that extends past the reflective surface one or more sidewalls by a distance that is 10.0 mm or less.

14. The cassette of claim 1, wherein each of the one or more inlet openings is aligned between two of the plurality of substrate supports.

15. The cassette of claim 14, wherein the one or more inlet openings are positioned as a plurality of flow levels.

16. The cassette of claim 15, wherein for each flow level the one or more inlet openings include a plurality of inlet openings spaced from each other circumferentially along the one or more sidewalls by an angle, and the angle is within a range of 20 degrees to 120 degrees.

17. The cassette of claim 15, wherein for each flow level the one or more inlet openings include a plurality of inlet openings having a cross-sectional shape that is circular or ovular.

18. The cassette of claim 15, wherein for each flow level the one or more inlet openings include one or more slots that extend circumferentially along the one or more sidewalls by a slot angle.

19. The cassette of claim 18, wherein the slot angle is within a range of 20 degrees to 120 degrees.

20. An apparatus for substrate processing, comprising:

- a chamber body comprising:
  - a processing volume,
  - a plurality of gas inject passages formed in the chamber body and positioned as a plurality of inject levels, and
  - one or more gas exhaust passages formed in the chamber body opposite the plurality of gas inject passages; and
- one or more heat sources configured to generate heat;
- a pedestal assembly positioned in the processing volume; and
- the cassette of claim 1, wherein the cassette is positioned in the processing volume and at least partially supported by the pedestal assembly, the cassette comprising:

a plurality of inlet openings formed in the one or more sidewalls and positioned as a plurality of flow levels, each flow level of the plurality of flow levels aligning with and in fluid communication with a respective inject level of the plurality of inject levels.

* * * * *